United States Patent
Okui et al.

(10) Patent No.: US 6,458,204 B1
(45) Date of Patent: Oct. 1, 2002

(54) METHOD OF PRODUCING HIGH-QUALITY SILICON SINGLE CRYSTALS

(75) Inventors: Masahiko Okui, Sanda; Hiroki Murakami, Saga; Kazuyuki Egashira, Saga; Makoto Ito, Saga; Hiroshi Hayakawa, Saga; Kelly Garret, Saga; Yoshinori Shirakawa, Saga, all of (JP)

(73) Assignee: Sumitomo Metal Industries, Ltd., Osaka (JP)

( * ) Notice: Subject to any disclaimer, the term of this patent is extended or adjusted under 35 U.S.C. 154(b) by 0 days.

(21) Appl. No.: 09/717,135

(22) Filed: Nov. 22, 2000

(30) Foreign Application Priority Data

Nov. 30, 1999 (JP) ............................................. 11-339466

(51) Int. Cl.$^7$ ............................................. C30B 15/20
(52) U.S. Cl. ......................................................... 117/30
(58) Field of Search .............................. 117/13, 20, 30, 117/32

(56) References Cited

U.S. PATENT DOCUMENTS

| | | | |
|---|---|---|---|
| 5,925,185 A | * 7/1999 | Kawashima et al. | 117/13 |
| 6,113,688 A | * 9/2000 | Kawanishi et al. | 117/30 |
| 6,159,438 A | * 12/2000 | Iida et al. | 423/328.2 |
| 6,190,452 B1 | * 2/2001 | Sakurada et al. | 117/20 |
| 6,261,361 B1 | * 7/2001 | Iida et al. | 117/19 |

FOREIGN PATENT DOCUMENTS

| | | |
|---|---|---|
| JP | 08-330316 | 12/1996 |
| JP | 11-79889 | 3/1999 |

* cited by examiner

Primary Examiner—Felisa Hiteshew
(74) Attorney, Agent, or Firm—Armstrong, Westerman & Hattori, LLP

(57) ABSTRACT

A method of producing high-quality and large-diameter single crystals by the Czochralski method is disclosed which can provide wafers with a minimized number of such grown-in defects as dislocation clusters and laser scattering tomography defects. Specifically, it is a method of producing silicon single crystals which comprises carrying out the crystal pulling while maintaining the solid-melt interface during pulling in the shape of an upward convex with the central portion of the interface being higher by at least 5 mm than the peripheral region thereof and while applying a magnetic field, and optionally in addition to the above, while maintaining the temperature gradient in the direction of axis of pulling in the peripheral region at a level lower than that in the central portion in the range of from the melting point to 1,200° C. In this case, it is desirable that the portion of the single crystal surface lying at least 50 mm above the melt surface be shielded from direct radiant heat from the heater and/or crucible wall, that a horizontal magnetic field of 0.08 to 0.3 T be applied in parallel with the melt surface or a cusped magnetic field showing an intensity of 0.02 to 0.07 T at a crucible wall site on the melt surface be applied and that the crucible be rotated at a speed of not more than 5 min$^{-1}$ and the single crystal at a speed of not less than 13 min$^{-1}$.

20 Claims, 5 Drawing Sheets

(a) (b)

METHOD OF PRODUCING HIGH-QUALITY SILICON SINGLE CRYSTALS

FIELD OF THE INVENTION

This invention relates to a method of producing silicon single crystals for use as semiconductor materials, namely silicon wafers. More particularly, it relates to a method of producing high-quality silicon single crystals for use as wafers, which are grown by the Czochralski method and free of grown-in defects.

DESCRIPTION OF THE PRIOR ART

It is Czochralski's method of growing single crystals that is most widely employed in the production of silicon single crystals for use as semiconductor silicon wafers.

The Czochralski method comprises dipping a silicon seed crystal in molten silicon in a quartz crucible and then pulling up the seed from the melt while allowing single crystal growth. Advances in this silicon single crystal growing technology have made it possible to produce dislocation-free large single crystals with few defects. Semiconductor devices are produced by hundreds of process steps starting with wafers which are obtained from such single crystals and serve as substrates. In that process, the substrates are exposed to a number of physical, chemical and thermal treatments, including such treatment in a severe thermal environment as high-temperature treatment at 1,000° C. or above. Therefore, there arises the problem of grown-in defects; micro-defects having latent origins in the process of single crystal growth manifest in such process of device production, possibly causing devices to underperform.

Typical examples of such micro-defects are distributed, for example, as shown in FIG. 1. The figure is a schematic representation of the results of micro-defect distribution observation by X-ray topography of a wafer which was sliced from a silicon single crystal just after growth, immersed in an aqueous solution of copper nitrate for Cu deposition thereon and then heat-treated. As seen, this wafer shows oxidation-induced stacking faults (hereinafter referred to as "OSF"), distributed in a ring-shaped zone at about two thirds of the outer diameter. Inside the ring-shaped zone, there are found laser scattering tomography defects, also called as COP or FPD, which are equally in a Si-deficient state. The ring of OSF (ring OSF) is directly surrounded by an oxygen precipitation promoted region where there is a tendency toward formation of deposits of oxygen precipitation. The latter is further surrounded by a denuded region where no defects appear. In the peripheral or outermost zone of the wafer, which surrounds the denuded region, defects called dislocation clusters readily manifest.

Generally, the sites of development of the above defects are strongly influenced by the pulling rate in the step of single crystal growth. A single crystal grown while varying the pulling rate within limits of rate of growth for obtaining dislocation-free sound single crystals, when examined for the distribution of each kind of defect on a longitudinal section along the central axis of the crystal, namely the pulling axis, gives such results as shown in FIG. 2.

When wafer planes resulting from perpendicular slicing to the pulling axis of single crystal are observed, a ring OSF manifests from the periphery of the crystal as the rate of growth is decreased after arriving at the desired diameter following shoulder formation. The diameter of this ring OSF, which is found initially on the peripheral region, gradually decreases with the decrease in growth rate, and the ring OSF finally disappears, whereupon the whole wafer surface is covered by the region outside the ring OSF. Thus, FIG. 1 is the sectional view, along the line A in FIG. 2 perpendicular to the pulling axis of the single crystal wafer grown at the pulling rate corresponding to A. When the position of ring OSF development is taken as a standard, a higher growth rate gives a faster grown single crystal wholly showing the region inside the ring OSF, while a slower growth rate gives a slower grown single crystal wholly showing the region outside the ring OSF.

It is well known that dislocations in a silicon single crystal cause deterioration in characteristics of a device formed therefrom. OSF deteriorate electric characteristics, for example increase the leakage current and these defects exist at a high density in the ring QSF. Therefore, single crystals for ordinary LSI are currently grown at a relatively high pulling rate so that the ring OSF may be distributed in the outermost region of each single crystal. In this way, the wafer is caused to be mostly composed of the region inside the ring OSF, namely of a faster grown single crystal, to thereby avoid dislocation clusters. This is also because the region inside the ring OSF is higher in gettering activity against heavy metal contamination possibly occurring in the process of device production than the region outside the ring OSF.

In recent years, the thickness of the gate oxide layer has been reduced for increasing the density of LSI and the temperatures in device production process have been lowered. Therefore, the number or density of OSF, which are apt to occur in high-temperature treatment, has become reduced and, owing also to the success in reducing the oxygen concentration in crystals, OSF, such as the ring OSF, have become less troublesome when evaluated as factors deteriorating device characteristics. The laser scattering tomography defects occurring as major defects in faster grown single crystals, however, have been shown to markedly deteriorate the dielectric strength of the gate oxide films, which are now fairly thin. With the increase in device pattern fineness, in particular, the influence of such defects becomes significant, rendering it difficult to cope with the task of increasing the scale of integration.

If it becomes possible to enlarge the oxygen precipitation promoted region just outside the ring OSF region as well as the denuded region in the defect distribution pattern shown in FIG. 1, the possibility will arise that wafers or single crystals having very few grown-in defects may be obtained. Thus, in Japanese Patent Application Laid-Open (JP Kokai) No. H08-330316, for instance, there is disclosed an invention relating to a method of enlarging the denuded region outside the ring OSF exclusively to the whole wafer surface or to the whole single crystal, without allowing formation of dislocation clusters, which method comprises controlling the temperature gradient within the crystal in a manner such that, in the temperature range of from the melting point to 1,300° C., the ratio V/G (where V is the pulling rate in single crystal growing (mm/min) and G is the temperature gradient (°C./mm) within the crystal in the direction of pulling axis) is 0.20 to 0.22 in the inner region ranging from the center of the crystal to 30 mm from the perimeter but gradually increases therefrom toward the boundary of the crystal. In that case, various conditions, such as the positions of the crucible and heater, the semiconical thermal radiator comprising carbon disposed around the growing single crystal and the insulator structure around the heater, are studied and selected for growing through overall heat transfer calculations so that the above temperature conditions may be satisfied.

Further, JP Kokai No. H11-79889 discloses an invention directed to a production method which comprises carrying out the pulling so that the shape of the solid-melt interface during single crystal growth may be ±5 mm relative to the average position of the solid-melt interface except for the 5-mm-wide zone around the single crystal, and controlling the inside temperatures of the furnace so that the temperature gradient difference $\Delta G=Ge-Gc$ (where Gc is the temperature gradient inside the crystal in the direction of pulling axis in the central region of the crystal in the range of 1,420° C. to 1,350° C., or from the melting point to 1,400° C. and Ge is that in the peripheral region of the crystal) may be not more than 5°C./cm. In other words, it is a production method according to which the solid-melt interface during growth is kept as flat as possible and the temperature gradient inside the single crystal from the solid-melt interface is maintained in a state as uniform as possible. It is mentioned that if single crystal growth is carried out under such conditions, the above-mentioned denuded region can be enlarged and, further, if a horizontal magnetic field not less than 0.2 T is applied to the melt, single crystals with fewer grown-in defects can be obtained more easily. However, the concrete means for realizing the above state in the crystal surroundings just after solidification, which are essential in producing the effects of that invention, for example the means for maintaining the solid-melt interface at a level within ±5 mm and the means for maintaining $\Delta G$ in the range of not more than 5° C./cm, seem to consist only in that a solid-liquid interface insulator surrounding the silicon single crystal just above the surface of molten silicon is disposed at a distance of 3 to 5 cm from the melt surface.

In the above invention, the temperature distribution state in the growing single crystal was estimated and studied by means of overall heat transfer analyzing software. However, such software can indeed estimate the temperature distribution under given conditions but cannot provide concrete controlling conditions for realizing a specific temperature distribution state in the single crystal surroundings.

SUMMARY OF THE INVENTION

It is an object of the present invention to provide a single crystal growing method capable of stably producing, by the Czochralski method, high-quality, large-diameter long single crystals, from which wafers with possibly fewest grown-in defects, such as dislocation clusters and laser scattering tomography defects, can be obtained.

The present inventors made investigations concerning the effects of growth conditions on grown-in defects starting with the ordinary growing method for producing single crystals having a diameter of 8 inches and varying various factors within the scope of that method.

In the investigations, wafers were sliced perpendicularly to the pulling axis of crystal at various levels of each single crystal after growing and subjected to defect detection and the defect distribution in the single crystal as a whole was established. Further, a single crystal was grown while the rate of pulling continuously varying, and test specimens were obtained by longitudinally slicing the single crystal along the central axis of pulling and examined for defect distribution. For detecting the distribution state of each kind of defect, wafers or test specimens were immersed in an aqueous solution of copper nitrate to thereby cause Cu deposition, and the surface of each wafer or test specimen was etched with Secco solution and, after heat treatment, examined by X ray topography. As for the density of dislocation clusters, the surface of each wafer or test specimen was etched with Secco solution and observed for defects under an optical microscope. Laser scattering tomography defects were detected by using the technique of laser scattering tomography.

In the ring OSF, oxygen precipitation promoted region and denuded region as shown in FIG. 1, there are no laser scattering tomography defects or dislocation clusters found. And, as mentioned hereinabove, the problems associated with the adverse effects of OSF and oxygen precipitation have been reduced as a result of the decreases in device production process temperature and in oxygen concentration in crystals, hence the presence of the ring OSF is now not so important as before.

However, it is judicious to avoid OSF and, it was considered that if the total of the denuded region and oxygen precipitation promoted region could be enlarged, single crystals or wafers would be obtained with reduced densities of both kinds of grown-in defect, namely laser scattering tomography defects and dislocation clusters. In other words, the upward angle of the V-shaped distribution state of the ring OSF as shown in FIG. 2 as a function of the pulling rate should be increased as far as possible, if possible to a horizontal state.

Therefore, first, the effects of the growing conditions on the defect distribution in single crystals were estimated by calculating, using overall heat transfer analyzing software, the shape of the solid-melt interface and the temperature distribution inside the single crystal in the process of growing while varying the pulling rate continuously and comparing the results with the results of an examination of defects inside the single crystal. As a result, a tendency was found for the denuded zone to enlarge in cases where the solid-melt interface was estimated to be level and in cases where the conditions were estimable such that the temperature distribution inside the single crystal just after solidification should be highly uniform. However, the whole wafer surface does not always consist of a denuded region but grown-in defects are found on the periphery or in the central region in many instances.

Nevertheless, in the process of these investigations, it was found that when the solid-melt interface has a shape such that it is high in the central region of the single crystal and it is low on the periphery, the crystal pulling in such a state allows stable enlargement of the denuded region to all over the wafer surface, which is perpendicular to the axis of single crystal pulling. Thus, the solid-melt interface of the growing single crystal should be convex upwardly.

For realizing a temperature distribution with good symmetry with respect to the center at the solid-melt interface, alleviating irregular temperature changes due to thermal convection, attaining uniform distribution of impurities and an additive element, and for other purposes, it is a common practice to rotate the crucible at a rate of about 5 to 15 revolutions per minute and the single crystal at a rate of about 10 to 18 revolutions per minute. In the example of the defect distribution as shown in FIG. 1 or FIG. 2, the single crystal was grown while rotating the crucible and single crystal in such respective ranges. The rotation of the crucible or single crystal may change the flow of the melt and thereby change the melt temperature distribution at the solid-melt interface. The temperature distribution inside the single crystal also changes according to the conditions of cooling of the single crystal as a result of pulling. When these are selected, the shape of the solid-melt interface varies.

Therefore, the relation between the rate of rotation of the crucible and of the single crystal and the shape of the solid-melt interface during growing was studied by growing single crystals with a diameter of 8 inches using a single crystal puller having the same shape and size and estimably showing the same temperature distribution as in conventional practice. First, when the rotational speed of the single crystal was low, the shape of the solid-melt interface was downwardly convex, namely was low in the middle. With the increase in rotational speed, the middle portion became higher than the peripheral zone but was still lower than the zone between the middle portion and the periphery in an M-shaped manner. A further increase in rotational speed resulted in the desired upwardly convex shape. It was judged, however, that the rotational speed of the single crystal cannot be varied widely from the generally employed range of rotational speed from the viewpoint of uniform dopant and other impurity distribution and of changes in shape of single crystals during pulling.

Next, as regards the rotational speed of the crucible, it was found that a downwardly convex or almost flat shape results in the conventionally employed range, that with the reduction in rotational speed, an M-shaped interface results, namely the middle portion and periphery become low while the portion therebetween becomes high, and that a further decrease in rotational speed results in an upwardly convex shape.

Based on such results, the rotational speed of the crucible, in particular, was varied and the resulting distribution of the ring OSF and the occurrence of grown-in defects were examined. As a result, conditions under which the whole wafer surface becomes a denuded region were found out by selecting the rotational speed of the crucible and of the single crystal and the pulling rate within the respective specific ranges. However, when single crystal pulling was carried out selecting the rotational speed of the crucible and of the single crystal in the above manner so that the whole wafer surface might be occupied by the denuded region, the diameter stability of the single crystal was apt to be disturbed halfway past the body length required of the single crystal and then it became impossible to obtain the denuded state to a satisfactory extent; thus, it was fairly difficult to grow the single crystal in a stable shape and in a denuded state over the whole length thereof.

The cause for this was supposed to be a change in convection state due to the decrease in melt volume, in particular, a change of the ascending convection current near the crucible wall. Therefore, attempts were made to suppress the flow of the melt by applying a horizontal (transverse) magnetic field or cusped magnetic field so that a magnetic field can be applied perpendicularly to the crucible wall. As a result, it became possible to grow single crystals in a substantially shape-stabilized manner from top to tail. However, the denuded region was somewhat inferior in stability. Hence further investigations were made and, as a result, it was found desirable that the cooling of the outer surface of the single crystal just after pulling from the melt is delayed a little. While the upwardly convex shape of the solid-melt interface is effective in decreasing the temperature gradient in the direction of pulling in the peripheral domain than in the middle portion, the application of a magnetic field tends to promote or suppress that upwardly convex shape. Slightly delaying the cooling of the outer surface of the single crystal is presumably effective in compensating such tendency. In this way, it has become possible to produce single crystals having fewest grown-in defects over the whole length thereof. The present invention thus consists the following.

(1) A method of producing silicon single crystals by pulling a silicon single crystal from the melt (molten silicon) which method comprises carrying out the pulling while maintaining the solid-melt interface in a shape such that the interface is upwardly convex, with the middle portion thereof being higher by more than 5 mm than the peripheral region, and while applying a magnetic field.

(2) A method of producing silicon single crystals by pulling a silicon single crystal from the melt which method comprises carrying out the pulling while maintaining the solid-melt interface in a shape such that the interface is upwardly convex, with the middle portion thereof being higher by more than 5 mm than the peripheral region, and further adjusting the temperature gradient in the direction of single crystal pulling so that the gradient in the peripheral region is slighter than that in the middle portion within the range of from the melting point to 1,200° C., and while applying a magnetic field.

(3) In carrying out the methods of producing silicon single crystals as mentioned above under (1) and (2), it is desirable that a heat shield for shielding radiant heat directly coming from the heater or crucible wall be disposed around the single crystal to be pulled at a position such that the lower end of the shield is 50 to 120 mm above the melt surface.

Further, in cases where a horizontal magnetic field of 0.08 to 0.3 T is applied to the melt in parallel with the melt surface, it is desirable that the pulling be carried out while rotating the crucible at a speed of not more than 5 min$^{-1}$ and the single crystal at a speed of not less than 13 min$^{-1}$. In cases where the center of the magnetic field is on the pulling axis from the melt surface to one half of the depth of the melt and where a cusped magnetic field of 0.02 to 0.09 T is applied in the horizontal direction at a crucible wall position corresponding to the height of the center of the magnetic field, it is desirable that the pulling be carried out while rotating the crucible at a speed of not more than 5 min$^{-1}$ and the single crystal at a speed of not less than 13 min$^{-1}$.

Here, the reason why the single crystal pulling carried out while the solid-liquid interface is in an upwardly convex state gives an enlarged denuded region is discussed.

A growing single crystal is cooled as a result of removal of the heat of the melt on the occasion of solidification and the latent heat of solidification by heat transfer through the solid and dissipation from the surface and, generally, the cooling proceeds in a state such that the central portion has a higher temperature and the peripheral region has a lower temperature. And, generally, the solid-melt interface becomes almost flat or upwardly convex with the central portion being higher when the pulling rate is relatively high and, when the pulling rate is relatively low, the interface becomes downwardly convex with the central portion being lower, although the state of the interface may also be influenced by the rotation of the single crystal or crucible. When, for example, the pulling rate is so high that the ring OSF occurs at a position close to the wafer periphery, the central portion is found somewhat higher, namely an upwardly convex state results.

The above state corresponds to that schematically shown in FIG. 3(a). Since, here, the solid-melt interface is maintained at a constant temperature, namely the solidification point of silicon, the distance between the interface and an isotherm within the single crystal in the direction of pulling axis is longer in the central portion (Lc) than in the peripheral or surrounding region (Ls). The temperature gradient in the direction of pulling Gc=ΔT/Lc (where ΔT is the temperature difference between the solid-melt interface and the isotherm) in the central portion of the single crystal is less than the temperature gradient in the same direction in the peripheral region of the single crystal Gs=ΔT/Ls.

On the contrary, when the solid-liquid interface is rendered upwardly convex by controlling the rotational speed of the single crystal and of the crucible, the temperature distribution within the crystal some distance away from the solid-melt interface will not change very much if the cooling conditions remain the same. Thus, the distance Lc in the direction of pulling axis from the solid-melt interface to the isotherm corresponding to the same $\Delta T$ is shorter than Ls, as shown in FIG. 3(b). Then, within a certain range from the solidification interface within the single crystal, the temperature gradient Gc in the direction of pulling axis in the central portion becomes greater than the temperature gradient Gs in the direction of pulling axis in the peripheral region.

When growing single crystal is pulled from the melt and the melt solidifies and turns into a solid crystal, the liquid phase, in which the atoms are randomly arranged turns into a solid phase in which the atoms are arranged in an ordered manner. Therefore, in the solid phase portion adjacent to the solid-melt interface, there are a number of vacancies, in which due atoms are absent, and interstitial atoms each of which is an extra Si atom occupying a position between the regular crystal lattice positions. Just after this solidification, vacancies lacking in due atoms are greater in number than interstitial atoms. As the portion that has become a portion of the single crystal upon solidification is pulled from the solid-melt interface, vacancies and interstitial atoms disappear as a result of migration, diffusion or recombination to leave an ordered arrangement of atoms. Upon further pulling up, however, the temperature lowers and, accordingly, the rate of migration or diffusion decreases, so that some vacancies and interstitial atoms remain.

The vacancies and interstitial atoms incorporated in the process of solidification can move fairly freely within the crystal when the temperature is high. The rate of migration or diffusion of vacancies is generally higher than that of interstitial atoms. And, as mentioned above, the number of vacancies is greater than that of interstitial atoms. The equilibrium concentration of vacancies and interstitial atoms capable of existing in the high-temperature crystal both decrease as the temperature decreases. Therefore, even if both species are present in equal numbers, the species at a lower temperature is higher in substantial concentration, namely in chemical potential, and that at a lower temperature is lower in that respect. In the growing of a single crystal, there is a temperature gradient in the vertical direction and it is presumable that, owing to this difference in substantial concentration as resulting from a temperature difference, diffusion occurs against the temperature gradient, namely in the direction from the lower temperature side to the growing single crystal on the higher temperature side, namely from the single crystal portion above the solid-melt interface to that interface. Hereinafter, this diffusion owing to the temperature gradient is referred to as "uphill diffusion".

Further, when vacancies or interstitial atoms arrive at the crystal surface, they disappear, so that the concentration thereof is low in the peripheral portion and, accordingly, diffusion in the direction toward the surface occurs in addition to the uphill diffusion. Furthermore, a vacancy is lacking in a lattice-constituting atom and an interstitial atom is an extra atom, so that when both collide with each other, they compensate for each other and coalesce and disappear, leaving a perfect crystal lattice.

The diffusion or recombination of vacancies and interstitial atoms occurs actively within the temperature range of the solidification point (1,412° C.) to about 1,200° C. and, presumably, the recombination due to diffusion still proceeds to a certain extent at lower temperatures although the rate thereof becomes slower. And, the temperature gradient in the vertical direction of pulling axis will change little even when the pulling rate changes if the structure of the hot zone, namely the surroundings of the cooling part for the single crystal during pulling, remains the same.

Under these circumstances, the concentration distributions of vacancies and interstitial atoms are presumably as schematically shown in FIG. 4. In the case of ordinary growing conditions, the concentration of vacancies and interstitial atoms each shows a curvature with the approach to the surface owing to the above-mentioned uphill diffusion and diffusion to the crystal surface. Since the rate of diffusion of vacancies is higher, the concentration curve for vacancies shows a sharper curvature as compared with interstitial atoms. Since, just after solidification, vacancies are greater in number than interstitial atoms, it is presumable that when the growing rate is relatively high, the concentration distributions of those on the corresponding wafer surface in the direction perpendicular to the axis of pulling are as shown in FIG. 4(a) (1). If cooling progresses while that state is maintained, the temperature lowers in such a state that excess vacancies, relative to interstitial atoms, are left behind. In this case, even when the disappearance thereof due to diffusion to the surface or coalescence proceeds to a certain extent, these leave their traces within the crystal, causing manifestation of laser scattering tomography defects. This corresponds to the faster grown single crystal portion shown in FIG. 2.

When, on the other hand, the pulling rate is relatively low, the crystal is maintained, for a prolonged period, in such a state that the uphill diffusion and diffusion to the surface occur actively and, therefore, vacancies diffuse and disappear faster than they satisfactorily bind with interstitial atoms, giving a state as shown in FIG. 4(a) (3). When the temperature arrives at a level at which the diffusions become inactive, excess interstitial atoms remain and the corresponding wafer surface wholly becomes the slowly grown single crystal portion shown in FIG. 2, in which portion dislocation clusters are apt to manifest.

At a medium pulling rate between the above two cases, the temperature falls while the concentration of vacancies and those of interstitial atoms are close to each other. Since, however, the respective concentration distributions differ in shape from each other, vacancies are in excess of interstitial atoms in the central portion of the single crystal whereas, in the peripheral region, vacancies are not enough, as shown in FIG. 4(a) (2). If cooling progresses in such a state, the result is that laser scattering tomography defects are distributed mainly in the central portion and dislocation clusters mainly in the vicinity of the outer surface, as shown in FIG. 1. In the portion between the peripheral and central portions, the number of vacancies is balanced against that of interstitial atoms and, upon further progress of cooling, these two species supposedly coalesce and disappear, giving a denuded zone where neither grown-in defects developed in the faster grown single crystal portion nor grown-in defects developed in slower grown single crystal portion are found.

In accordance with the present invention, the shape of the solid-melt interface is rendered upwardly convex, as shown in FIG. 3(b), by setting the rotational speed of the crucible and that of the single crystal at respective appropriate levels. The effects of the upwardly convex shape are now explained. The temperature distribution within the single crystal depends almost solely on the cooling conditions for the single crystal portion and will not be influenced very much by the shape of the solid-melt interface. When this interface becomes upwardly convex, the interval between the isotherms within the single crystal broadens in the peripheral region as compared with that in the central portion and the temperature gradient in the direction of pulling axis becomes moderated, as shown in FIG. 3(b). Then, the disappearance of vacancies by uphill diffusion in the peripheral region is relatively alleviated and the curvature of the upward convexity of the concentration distribution becomes less. As a result, when the pulling rate is such that the vacancy concentration approaches to the interstitial atom concentration, the concentration distribution of vacancies and that of interstitial atoms become almost equal to each other, as shown in FIG. 4(b) (2), so that the denuded region can be realized all over the wafer surface.

Since, here, application of a magnetic field suppresses the flow of the melt as caused by the rotation of the crucible and of the single crystal, stable growing becomes possible even when the amount of the melt decreases as a result of pulling. In this way, the denuded region can be enlarged over the whole length and it becomes easy to produce single crystals having a good shape. A magnetic field in the horizontal direction and a cusped magnetic field differ to some extent in the effect of promoting the upwardly convex shape of the solid-melt interface, hence it is desirable that the rotational speed of the single crystal is varied to some extent within the range mentioned above according to the magnetic field to be applied and the intensity thereof.

For easier realization of the upwardly convex shape of the solid-melt interface, it is judicious to take measures for preventing the temperature of the surface of the single crystal being grown within the range from the melt surface to a some distance above the same from falling by means of direct radiant heat from the heater or crucible wall and for shielding the region further thereabove from radiant heat or approaching a cooling body to that region, for instance. The state of FIG. 4(b) (2) is maintained, in that manner, by decreasing the temperature gradient in the peripheral region of the single crystal as compared with the central portion thereof.

DESCRIPTION OF PREFERRED EMBODIMENTS

Figure 1:
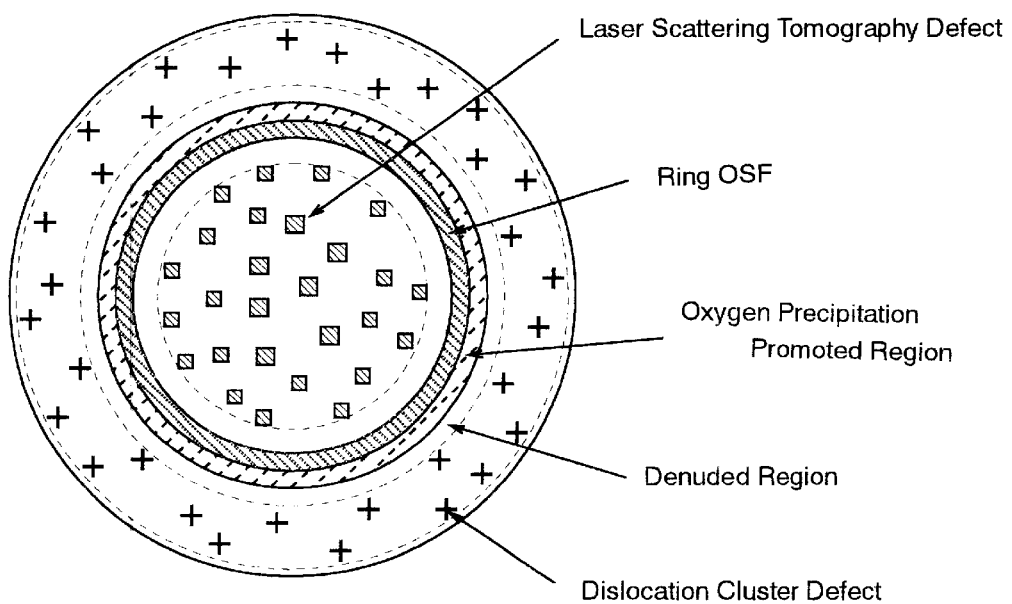
FIG. 1 is a schematic representation of a defect distribution example typically observed on silicon wafers.
Figure 2:
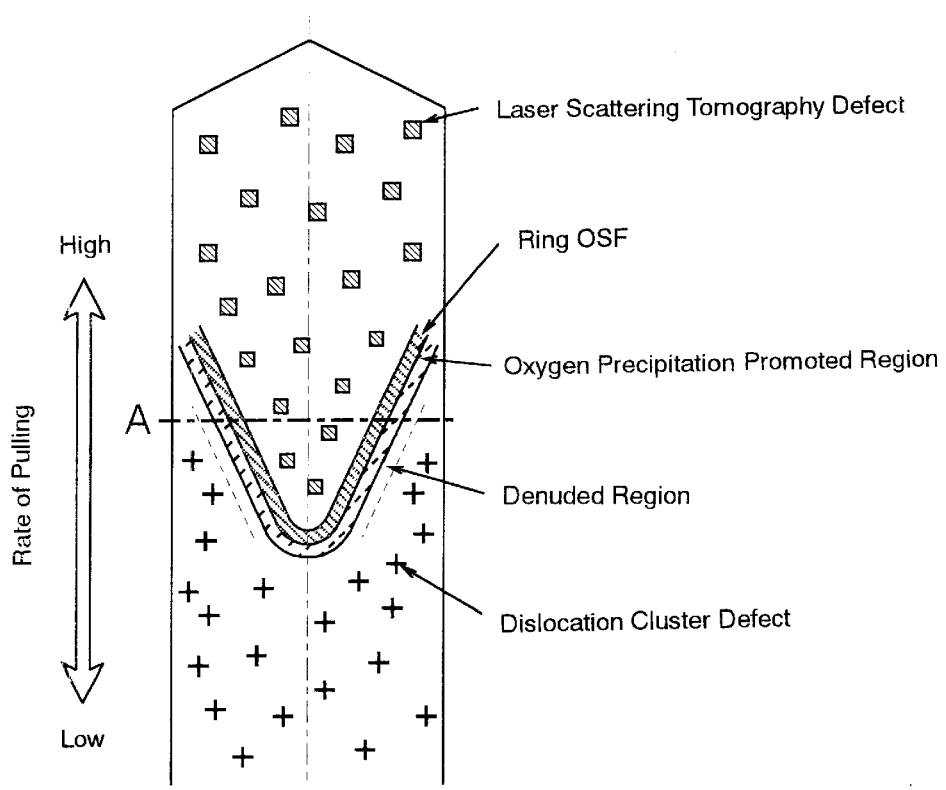
FIG. 2 is a schematic representation of the general relation between the pulling rate during single crystal growing and the sites of occurrence of crystal defects.
Figure 3:
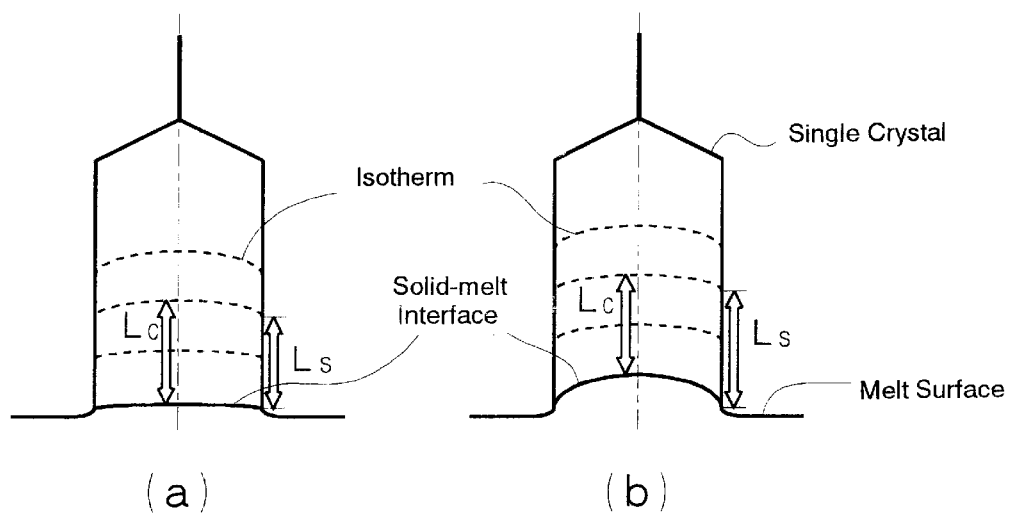
FIGS. 3A–3B is a schematic representation of the solid-melt interface during a single crystal growing and the temperature distribution in the direction of diameter within the single crystal.
Figure 4:
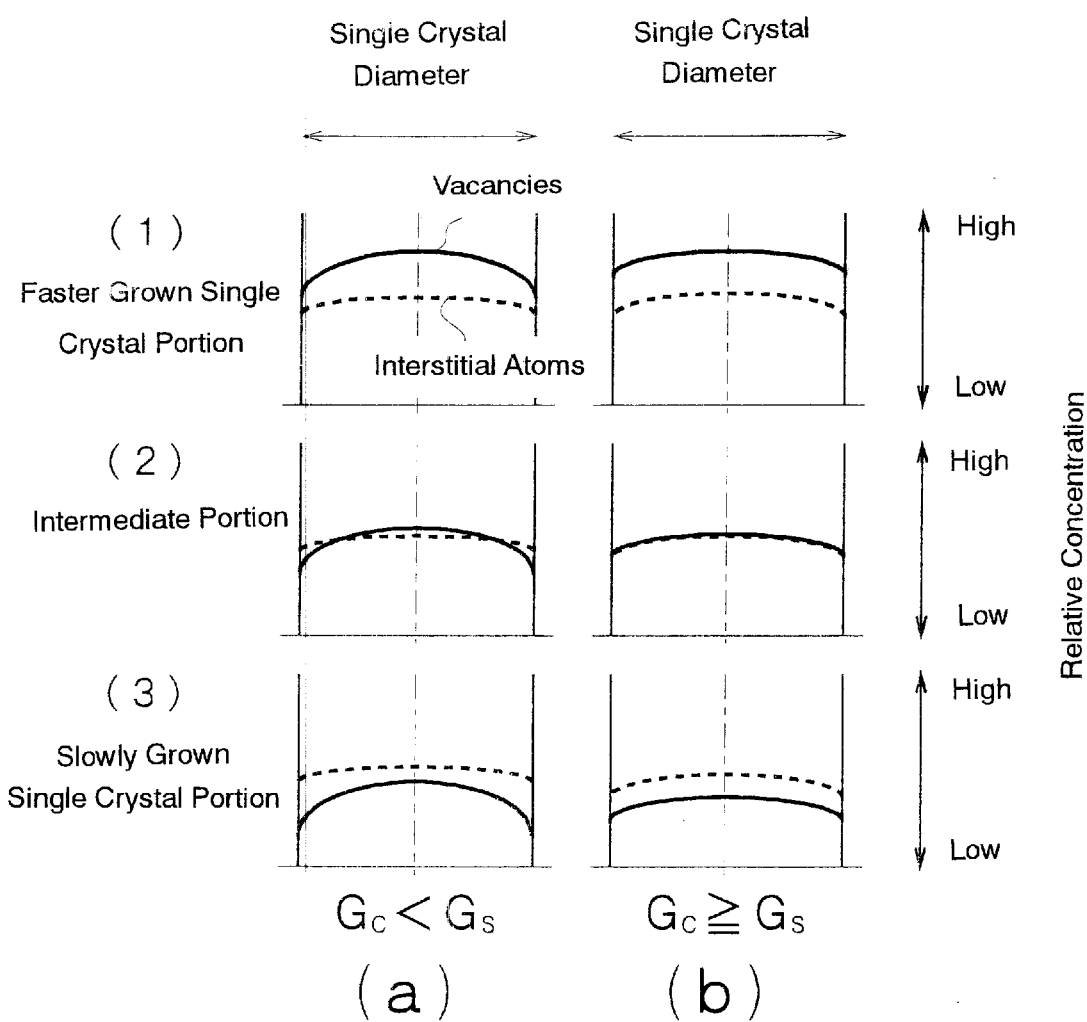
FIGS. 4A–4B is a schematic representation of the difference in concentration distribution between vacancies and interstitial atoms as arising from the difference in temperature gradient in the direction of pulling axis between the central portion and peripheral region within the growing of a single crystal.

According to the present invention which relates to a method of producing single crystals by the Czochralski method while applying a magnetic field, single crystals are grown while maintaining the solid-melt interface in the shape of an upward convex, as schematically shown in FIG. 3(b). On that occasion, the shape of the solid-melt interface is made upwardly convex with the central portion thereof being higher by not less than 5 mm than the peripheral region thereof This is because, when the height difference is less than 5 mm, the possibility is prevented of providing the whole wafer surface derived from the single crystal, which is the target of the invention, with a denuded region where no grown-in defects are present.

As mentioned above, the central portion of the upwardly convex solid-melt interface is required to have a height of at least 5 mm, desirably about 12 to 15 mm. Although it is possible to raise the height still further by selecting the rotational speed of the single crystal and/or the rotational speed of the crucible and, further, the method of cooling the single crystal, to make the upwardly convex shape more remarkable is not desirable for growing sound single crystals at an appropriate pulling rate.

The temperature gradient in the direction of pulling axis within the single crystal in the temperature range of between the melting point and 1,200° C. is made less in the peripheral region than in the central portion. By this measure, it becomes possible to more stably realize the denuded region all over the whole wafer surface. When the temperature gradient in the direction of pulling axis in the central portion is equal to or less than that in the peripheral region, the above-mentioned effects of the upwardly convex shape of the solid-melt interface may not be fully produced. Since, in the range of from the melting point to 1,200° C., vacancies and interstitial atoms can move with ease and diffusion and coalescence take place actively, it is necessary to sufficiently control the temperature distribution within the single crystal in that temperature range.

As means of rendering the solid-melt interface upwardly convex, it is necessary to control the flow of the melt as caused by the rotation of the crucible and of the single crystal. Thus, in cases where the magnetic field applied to the melt is a horizontal, magnetic field, the rotational speed of the crucible should be not more than 7 $min^{-1}$ and, in the case of a cusped magnetic field, the speed of the crucible should be not more than 5 $min^{-1}$, while the rotational speed of the single crystal should be not less than 13 $min^{-1}$ in either case.

In the case of a cusped magnetic field, it is necessary to somewhat reduce the rotational speed of the crucible since it is weak in the effect of suppressing the flow of the melt within the crucible as compared with a horizontal magnetic field. When the rotational speed of the crucible is in excess of the above limit, magnetic field application makes it difficult for the melt having a relatively high temperature and occurring in the vicinity of the crucible wall to flow into the interface where the single crystal is growing, so that rapid solidification results in the central portion and peripheral region of the lower surface of the growing single crystal, hence it becomes difficult to attain an upwardly convex solid-melt interface. In either case, the rotational speed of the crucible is preferably not higher than 3 $min^{-1}$ and, in some instances, it may be zero, namely the crucible may not be rotated.

The rotational speed of the single crystal is selected at a level not lower than 13 $min^{-1}$, since such speed is necessary for sufficiently causing the Cochran current, which is an ascending current, in the central portion of the crucible either in the case of horizontal magnetic field application or in the case of cusped magnetic field application. By causing the melt to flow in that manner, it is possible for the high temperature ascending current of the melt to arrive at the central portion of the crucible, namely the middle of the lower surface of the growing crystal, to thereby maintain the upwardly convex shape of the solid-melt interface. When the rotational speed of the single crystal is lower than 13 min$^{-1}$, the solid-melt interface acquires an M shape with the central portion being depressed to a certain extent or, in extreme cases, it acquires a downwardly convex shape and thus it becomes impossible to obtain the single crystal showing fewer defects all over the wafer surface. Conversely, when the rotational speed is excessively high, the rate of crystal growth decreases and the single crystal may undergo deformation. Hence, the rotational speed is recommendably not more than 25 min$^{-1}$, desirably it is within the range of 15 to 23 min$^{-1}$.

A magnetic field is applied to the melt within the crucible during the single crystal pulling. The magnetic field to be applied is a horizontal magnetic field parallel to the melt surface and having an intensity of 0.08 to 0.45 T, or a cusped magnetic field the center of which is on the axis of pulling and between the melt surface and one half of the melt depth and which shows an intensity of 0.02 to 0.09 T at the crucible wall position in the horizontal direction.

As the amount of the melt in the crucible decreases, the flow of the melt as caused by the rotation of the single crystal changes and, halfway past the required crystal length and further thereon, the diameter stability may be disturbed or the upwardly convex state of the solid-melt interface may become unstable. Therefore, a magnetic field is applied to the melt from the first to thereby suppress the flow thereof so that the flowing state of the melt in the vicinity of the solid-melt interface may not change even when the amount of the melt in the crucible changes. A horizontal magnetic field and a cusped magnetic field both can control the vertical flow of the melt, hence they are effective for the intended purpose.

When, in the case of a horizontal magnetic field, the intensity is less than 0.08 T, the effect in rendering the solid-melt interface upwardly convex is insufficient. A magnetic field exceeding 0.45 T suppresses the flow of the melt excessively, deteriorating the resistivity distribution and oxygen concentration distribution on the wafer surface. An intensity of 0.2 to 0.3 T is preferred. In the case of a cusped magnetic field, when the intensity at the position mentioned above is less than 0.02 T, the effect in rendering the solid-melt interface upwardly convex is insufficient. When it is in excess of 0.09 T, the resistivity distribution and oxygen concentration distribution on the wafer surface become deteriorated, like in the case of a horizontal magnetic field. A preferred range for a cusped magnetic field application is 0.03 to 0.08 T. In applying such cusped magnetic field, the center of the magnetic field should be from the melt surface to one half of the melt depth so that the magnetic field in the horizontal direction may be intensified to thereby suppress the vertical flow of the melt in the vicinity of the crucible wall.

Figure 5:
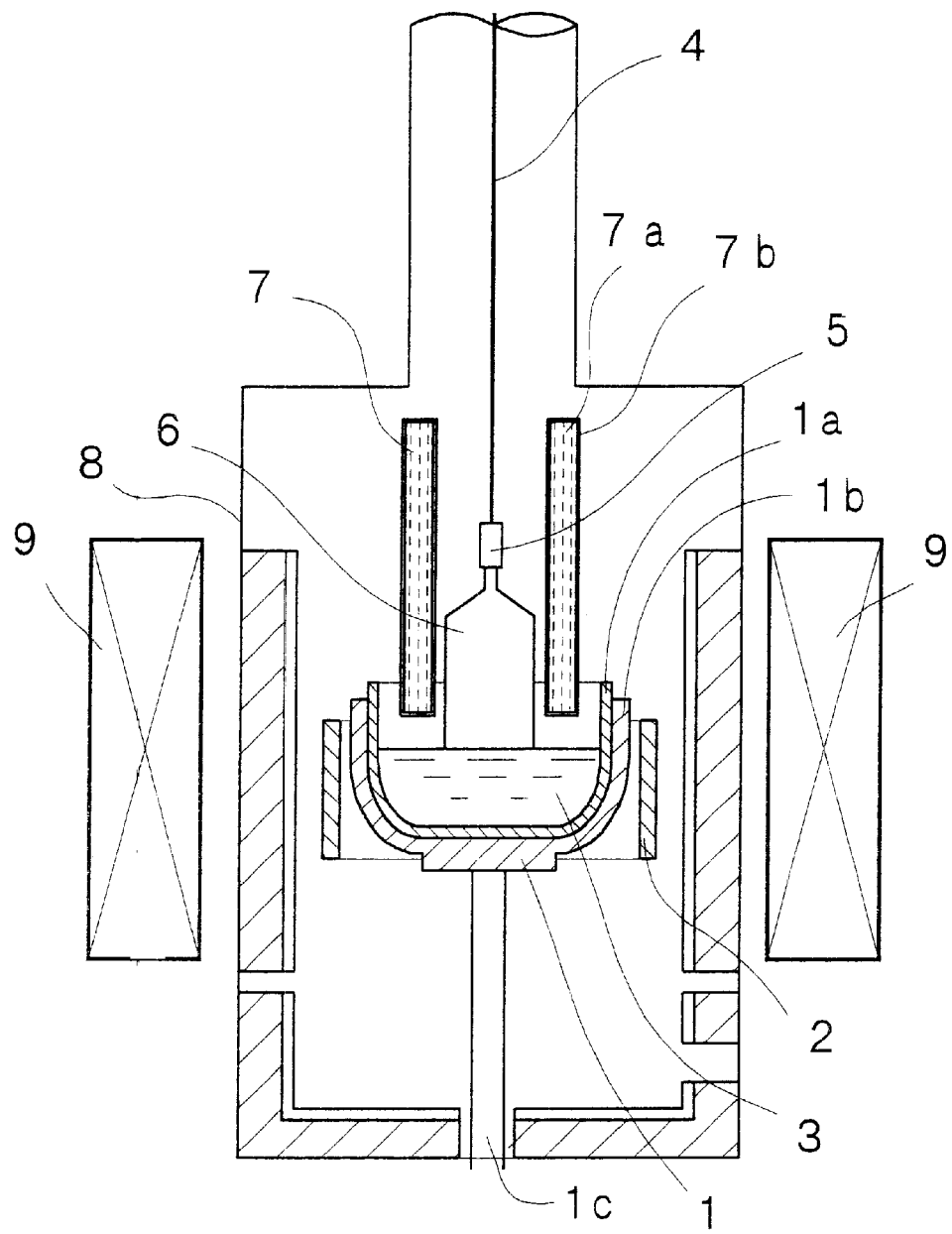
FIG. 5 is a schematic representation of a single crystal pulling apparatus to be used in carrying out the method of the present invention.

A heat shield is disposed around the single crystal during pulling, as schematically shown in FIG. 5. The distance between the melt surface and the lower end of this heat shield is not less than 50 mm. This measure is taken for the purpose of suppressing the fall of the temperature on the single crystal surface by means of radiant heat from the crucible wall and melt surface and thereby making it more certain that a slighter temperature gradient in the direction of axis of pulling in the range of from the melting point to 1,200° C. is realized in the peripheral region as compared with the central portion. Magnetic field application suppresses the flow of the melt and influences the formation of an upward convex at the solid-melt interface and is therefore effective in compensating the same. When the distance between the lower end of the heat shield and the melt surface is less than 50 mm, the temperature gradient in the single crystal periphery is decreased only insufficiently as compared with the central portion. When, however, the distance is longer than 120 mm, the effect arrives at saturation and the pulling rate can no longer be increased.

The heat shield may have a cylindrical or inverted truncated cone shape, a combination of these or any other shape capable of shielding radiant heat from the crucible wall and melt surface. The material thereof is not particularly restricted but the use of carbon felt, high purity graphite or the like material effective as a heat insulator is desirable.

EXAMPLES

Using a single crystal puller allowing application of a horizontal magnetic field or cusped magnetic field, as shown in FIG. 5, 8-inch silicon single crystals were grown. Thus, a crucible 1a was charged with 120 kg of polycrystalline silicon as the starting material, and the p-type dopant boron was added thereto in an amount to give a crystal electric resistance of about 10 Ωcm. An argon atmosphere at 1,333 Pa was used as the atmosphere within the apparatus. The heat shield 7 used had a structure such that a cylindrical carbon felt body 7a with an inside diameter of 300 mm and a thickness of 50 mm was covered with a 7 mm-thick high purity graphite layer 7b. The shield was disposed so that the lower end thereof was 90 mm above the surface of the melt 3. An exciting coil 9 was disposed outside the stainless steel chamber 8 and a horizontal magnetic field or cusped magnetic field was applied by exchanging the coil.

The materials charged into the crucible 1a were heated by means of a heater 2 and, after melting, the lower end of a seed crystal 5 was dipped in the melt 3. The single crystal 6 was then pulled while rotating the crucible 1 and the pulling shaft 4 and, during the period from neck and shoulder formation to a pulling length of about 200 mm following arriving at the predetermined body diameter, the steady state conditions specified in Table 1 or Table 2 were established.

Since the optimum pulling rate may vary to a certain extent depending on the characteristics of the apparatus, such rates as capable of minimizing grown-in defects over the whole length of the single crystal were selected in advance by carrying out the pulling while gradually varying the rate. The cases of horizontal magnetic field application are shown in Table 1 and the cases of cusped magnetic field application are shown in Table 2. Thereafter, each state specified was maintained until arrival at a total body length of about 1,000 mm. Following the subsequent tailing, each single crystal growing was completed. The temperature distribution inside each single crystal during pulling was estimated by heat transfer analyzing simulation calculations and, based thereon, the temperature gradient in the direction of pulling axis in the central portion and that in the peripheral region of the single crystal as well as the shape of the solid-melt interface were determined.

Wafers were sliced from each single crystal obtained at an upper part, intermediate part and lower part after arrival at the stationary state, immersed in a 16% (by weight) aqueous solution of copper nitrate for Cu deposition, heated at 900° C. for 20 minutes, then cooled and observed for locating the OSF ring by X-ray tomography. Further, the density of laser scattering tomography defects was determined by laser tomography and the density of dislocation clusters by Secco etching. Wafers sliced from the positions adjacent to the sites of slicing of wafer specimens subjected to such defect distribution examination were subjected to conventional heat and other treatments and then a device gate structure was constructed on each wafer, and the time-zero dielectric breakdown (TZDB) at an oxide layer thickness of 25 nm was measured and the nondefective percentage was calculated in terms of TZDB.

The results obtained in those examinations are shown in Table 1 and Table 2. As is evident from those results, it can be seen that by confining the rotational speed of the single crystal and that of the crucible within the respective specified ranges, it becomes possible to render the shape of the solid-melt interface upwardly convex and thereby make the temperature gradient in the vertical direction of the single crystal in the peripheral region thereof smaller than that in the central portion. By further applying an appropriate magnetic field thereto, it is possible to obtain single crystals showing few occurrences of such grown-in defects as laser

TABLE 1

| Test No. | Magnetic field applied | | Growth conditions | | | Solid-melt interface shape (height of middle relative to periphery) (mm) | Vertical direction temperature gradient (m.p. to 1,200° C.) (° C./min) | Site of crystal | Single crystal examination results | | | | Note |
|---|---|---|---|---|---|---|---|---|---|---|---|---|---|
| | Magnetic field | Intensity (T) | Crystal rotation speed (min$^{-1}$) | Crucible rotation speed (min$^{-1}$) | Rate of pulling (mm/min) | | | | Ring OSF relative to outside diameter (%) | Laser scattering tomography defects, mean density (/cm$^3$) | Dislocation clusters, mean density (/cm$^3$) | Percent good slices in terms of TZDB* (%) | |
| 1 | None | — | 17 | 5 | 0.40 | 2–4 | Middle: 2.3–2.5 Periphery: 2.1–2.2 | Upper Middle Lower | 43 42 39 | 4.6 × 10$^4$ 4.4 × 10$^4$ 4.1 × 10$^4$ | 5.2 × 10$^3$ 5.3 × 10$^3$ 5.6 × 10$^3$ | 68.3 67.6 66.5 | Compar. Example |
| 2 | Horizontal | 0.2 | 17 | 5 | 0.48 | 8–12 | Middle: 2.7–2.8 Periphory: 2.0–2.1 | Upper Middle Lower | 0 0 0 | 0 0 0 | 0 0 0 | 95.4 95.6 96.1 | Example of Invention |
| 3 | Horizontal | 0.2 | 20 | 1 | 0.52 | 12–17 | Middle: 2.8–2.9 Periphery: 2.0–2.1 | Upper Middle Lower | 0 0 0 | 0 0 0 | 0 0 0 | 96.5 96.8 97.2 | Example of Invention |

*Time-zero dielectric breakdown

TABLE 2

| Test No. | Magnetic field applied | | Growth conditions | | | Solid-melt interface shape (height of middle relative to periphery) (mm) | Vertical direction temperature gradient (m.p. to 1,200° C.) (° C./min) | Site of crystal | Single crystal examination results | | | | Note |
|---|---|---|---|---|---|---|---|---|---|---|---|---|---|
| | Magnetic field | Intensity (T) | Crystal rotation speed (min$^{-1}$) | Crucible rotation speed (min$^{-1}$) | Rate of pulling (mm/min) | | | | Ring OSF relative to outside diameter (%) | Laser scattering tomography defects, mean density (/cm$^3$) | Dislocation clusters, mean density (/cm$^3$) | Percent good slices in terms of TZDB* (%) | |
| 4 | Cusp | 0.03 | 17 | 4 | 0.45 | 6–7 | Middle: 2.6–2.7 Periphery: 2.0–2.1 | Upper Middle Lower | 0 0 0 | 0 0 0 | 0 0 0 | 91.7 91.5 91.9 | Example of Invention |
| 5 | Cusp | 0.03 | 17 | 1 | 0.50 | 10–15 | Middle: 2.7–2.8 Periphery: 2.0–2.1 | Upper Middle Lower | 0 0 0 | 0 0 0 | 0 0 0 | 95.3 95.7 96.3 | Example of Invention |
| 6 | Cusp | 0.06 | 17 | 4 | 0.40 | 4–6 | Middle 2.4–2.5 Periphery: 2.0–2.1 | Upper Middle Lower | 0 0 0 | 0 0 0 | 0 0 0 | 90.3 91.1 91.6 | Example of Invention |
| 7 | Cusp | 0.06 | 17 | 1 | 0.42 | 8–12 | Middle 2.5–2.6 Periphery: 2.0–2.1 | Upper Middle Lower | 0 0 0 | 0 0 0 | 0 0 0 | 92.0 92.2 93.0 | Example of Invention |

*Time-zero dielectric breakdown scattering tomography defects and dislocation cluster defects over the whole length thereof.

As illustrated hereinabove, when the method of growing silicon single crystals according to the invention is employed, long, large-diameter and high-quality silicon single crystals can be produced by the Czochralski method while eliminating such grown-in defects as dislocation clusters and laser scattering tomography defects. Wafers obtained from the thus-produced single crystals have few harmful defects capable of deteriorating device characteristics, hence they can be effectively applied in coping with still higher integration device designs and miniaturization of devices in the future.

What is claimed is:

1. A method of producing silicon single crystals comprising the step of pulling a single crystal from a melt, wherein the pulling is carried out while maintaining the solid-melt interface during pulling in the shape of an upward convex with the central portion of the interface being higher by more than 5 mm than the peripheral region thereof and while applying a magnetic field.

2. A method of producing silicon single crystals according to claim 1, wherein the solid-melt interface is maintained in an upwardly convex shape with the central portion of the interface being higher by 12 to 15 mm than the peripheral region thereof.

3. A method of producing silicon single crystals according to claim 1, wherein, as a heat shield for shielding direct radiant heat from at least one of the heater and crucible, a wall is disposed around the single crystal during pulling in a manner such that the lower end of the shield is 50 to 120 mm above the melt surface.

4. A method of producing silicon single crystals according to claim 3, wherein the heat shield has a cylindrical or inverted truncated cone shape or a shape resulting from combination thereof and is made of carbon felt or high quality graphite.

5. A method of producing silicon single crystals according to claim 1, wherein a horizontal magnetic field of 0.08 to 0.45 T is applied to the melt in parallel with the melt surface.

6. A method of producing silicon single crystals according to claim 5, wherein the pulling is carried out at a crucible rotational speed of not more than 7 $min^{-1}$ and at a single crystal rotational speed of not less than 13 $min^{-1}$.

7. A method of producing silicon single crystals according to claim 6, wherein the pulling is carried out at a single crystal rotational speed within the range of 15 to 23 $min^{-1}$.

8. A method of producing silicon single crystals according to claim 1, wherein a cusped magnetic field is applied whose magnetic field center is on the pulling axis between the melt surface and one half of the melt depth and which shows an intensity of 0.02 to 0.09 T in the horizontal direction as measured on a crucible wall site on the same level as the center of magnetic field.

9. A method of producing silicon single crystals according to claim 8, wherein the pulling is carried out at a crucible rotational speed of not more than 5 $min^{-1}$ and at a single crystal rotational speed of not less than 13 $min^{-1}$.

10. A method of producing silicon single crystals according to claim 9, wherein the pulling is carried out at a single crystal rotational speed within the range of 15 to 23 $min^{-1}$.

11. A method of producing silicon single crystals comprising the step of pulling a single crystal from a melt, wherein the pulling is carried out while maintaining the solid-melt interface during pulling in the shape of an upward convex with the central portion of the interface of being higher by more than 5 mm than the peripheral region thereof and while keeping the temperature gradient in the direction of pulling axis within the single crystal smaller in the peripheral region of the crystal than in the central portion thereof in the temperature range of from the melting point to 1,200° C., and while applying a magnetic field.

12. A method of producing silicon single crystals according to claim 11, wherein the solid-melt interface is maintained in an upwardly convex shape with the central portion of the interface being higher by 12 to 15 mm than the peripheral region thereof.

13. A method of producing silicon single crystals according to claim 11, wherein, as a heat shield for shielding direct radiant heat from at least one of the heater and crucible, a wall is disposed around the single crystal during pulling in a manner such that the lower end of the shield is 50 to 120 mm above the melt surface.

14. A method of producing silicon single crystals according to claim 13, wherein the heat shield has a cylindrical or inverted truncated cone shape or a shape resulting from combination thereof and is made of carbon felt or high quality graphite.

15. A method of producing silicon single crystals according to claim 11, wherein a horizontal magnetic field of 0.08 to 0.45 T is applied to the melt in parallel with the melt surface.

16. A:method of producing silicon single crystals according to claim 15, wherein the pulling is carried out at a crucible rotational speed of not more than 7 $min^{31\ 1}$ and at a single crystal rotational speed of not less than 13 $min^{-1}$.

17. A method of producing silicon single crystals according to claim 16, wherein the pulling is carried out at a single crystal rotational speed within the range of 15 to 23 $min^{-1}$.

18. A method of producing silicon single crystals according to claim 11, wherein a cusped magnetic field is applied whose magnetic field center is on the pulling axis between the melt surface and one half of the melt depth and which shows an intensity of 0.02 to 0.09 T in the horizontal direction as measured on a crucible wall site on the same level as the center of magnetic field.

19. A method of producing silicon single crystals according to claim 18, wherein the pulling is carried out at a crucible rotational speed of not more than 5 $min^{-1}$ and at a single crystal rotational speed of not less than 13 $min^{-1}$.

20. A method of producing silicon single crystals according to claim 19, wherein the pulling is carried out at a single crystal rotational speed within the range of 15 to 23 $min^{-1}$.

* * * * *